United States Patent
Watanabe et al.

(10) Patent No.: US 6,859,085 B2
(45) Date of Patent: Feb. 22, 2005

(54) MIXER CIRCUIT AND DIFFERENTIAL AMPLIFIER CIRCUIT

(75) Inventors: Daisuke Watanabe, Osaka (JP); Junji Itoh, Osaka (JP); Ikuo Imanishi, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/649,707

(22) Filed: Aug. 28, 2003

(65) Prior Publication Data

US 2004/0061544 A1 Apr. 1, 2004

(30) Foreign Application Priority Data

Sep. 27, 2002 (JP) ........................................ 2002-282479

(51) Int. Cl.[7] .............................................. G06F 7/556
(52) U.S. Cl. ...................................... 327/359; 327/357
(58) Field of Search ................................ 327/356, 357, 327/359; 455/333

(56) References Cited

U.S. PATENT DOCUMENTS

| 5,339,458 | A | * | 8/1994 | Nakatsuka et al. | ......... 455/333 |
| 6,026,286 | A | * | 2/2000 | Long | ......... 455/327 |
| 6,229,395 | B1 | * | 5/2001 | Kay | ......... 330/252 |
| 6,665,527 | B2 | * | 12/2003 | Schiltz | ......... 455/326 |

FOREIGN PATENT DOCUMENTS

JP 05175755 7/1993

* cited by examiner

*Primary Examiner*—Kenneth B. Wells
(74) *Attorney, Agent, or Firm*—McDermott Will & Emery LLP

(57) ABSTRACT

A mixer circuit is composed of a differential amplifier circuit and a DBM circuit. The differential amplifier circuit has a first bipolar transistor, a second bipolar transistor, a first resistor provided between the respective bases of the first and second bipolar transistors, and a capacitor provided between the base of the second bipolar transistor and the ground. Since the first resistor and the capacitor are provided such that the circuit undergoes RC oscillation in response to the third harmonic of an input signal, the third and higher-order harmonics can be reduced.

22 Claims, 5 Drawing Sheets

US 6,859,085 B2

MIXER CIRCUIT AND DIFFERENTIAL AMPLIFIER CIRCUIT

BACKGROUND OF THE INVENTION

The present invention relates to a differential amplifier circuit and a mixer circuit using the same and capable of integration and, more particularly, to a differential amplifier circuit and a mixer circuit which can be used in equipment for mobile communication.

In the field of information communication, the development of technologies using higher RF frequencies including wideband CDMA using RF frequencies in the 2 GHz range, Bluetooth using RF frequencies in the 2.4 GHz range, and a wireless LAN using further higher RF frequencies has advanced recently.

The amplification of extremely weak signals with transmitted/received RF frequencies in equipment such as a terminal device or a wireless base station used for such information communication is not only costly but also requires multi-stage amplifiers. It is therefore normal practice to convert RF frequencies received from, e.g., an antenna to signals at lower frequencies. In such a case, an RF mixer circuit using a differential amplifier circuit is used to convert RF signals to signals with lower frequencies.

FIG. 6 is a circuit diagram showing a structure of a conventional double-balanced RF mixer circuit.

The RF mixer circuit shown in the drawing is composed of: a differential amplifier circuit 111; and a double-balanced mixer circuit (hereinafter referred to as the DBM circuit) 110 connected to the differential amplifier circuit 111. When a radio-frequency signal (RF signal) is inputted to the differential amplifier circuit 111 and a local oscillation signal (local signal: LO signal) is inputted to the DBM circuit 110, these signals are mixed in the DBM circuit 110 so that an intermediate frequency signal (IF signal) with a lower frequency is outputted.

The differential amplifier circuit 111 has: a first bipolar transistor 105; an RF signal input port connected to the base of the first bipolar transistor 105; a second bipolar transistor 106 having a base connected to the ground via a capacitor 401 and an emitter connected to the emitter of the first bipolar transistor 105; resistors 202 and 203 connected between the respective emitters of the first and second bipolar transistors 105 and 106; and a current source connected between the resistors 202 and 203 and having a resistor 201. In the differential amplifier circuit 111, if an RF signal with a frequency $f_1$ is inputted to the RF signal input port, signals each having a frequency $F_1$ and having a 180° phase difference therebetween are outputted from the respective collectors of the first and second bipolar transistors 105 and 106.

On the other hand, the DBM circuit has: third and fourth bipolar transistors 101 and 102 having respective emitters connected to each other; fifth and sixth bipolar transistors 103 and 104 having respective emitters connected to each other; first and second LO signal input ports; and first and second IF signal output ports. The respective bases of the third and sixth bipolar transistors 101 and 104 are connected to each other and also connected to the first LO signal input port. The respective bases of the fourth and fifth bipolar transistors 102 and 103 are connected to each other and also to the second LO signal input port.

To the first and second LO signal input ports, signals each having a frequency $f_2$ and having a 180° phase difference therebetween are inputted. The respective collectors of the third and fifth bipolar transistors 101 and 103 are connected to the first IF signal output port. The respective collectors of the fourth and sixth bipolar transistors 102 and 104 are connected to the second IF signal output port. When LO signals are inputted to the first and second LO signal input ports and output signals from the differential amplifier circuit 111 are inputted to the third, fourth, fifth, and sixth bipolar transistors 101, 102, 103, and 104, output signals having equal frequencies and equal amplitudes and a 180° phase difference therebetween are outputted from the first and second IF signal output ports.

In the present specification, one and the other of the signals having equal frequencies and equal amplitudes and a 180° phase difference therebetween will be hereinafter referred to as the "non-inverted" signal and the "inverted" signal, respectively.

The conventional mixer circuit has used the differential amplifier circuit which generates two balanced output signals which are non-inverted and inverted to improve a distortion property. In other words, the equal amplitudes of the two balanced output signals from the differential converting amplifier circuit and the 180° phase difference therebetween have reduced the non-linearity between the output signals. As a consequence, the conventional RF mixer circuit has been reduced in noise and harmonics compared with a single-balanced RF mixer circuit. The harmonics are defined herein as signals having frequencies which are integral multiples of an inputted signal.

On the other hand, Japanese Laid-Open Patent Publication No. HEI 5-175755 discloses an example of a double-balanced RF mixer circuit using field effect transistors in place of bipolar transistors. Even when the field effect transistors are used, distortion in output signals can be reduced in the same manner as in the mixer circuit mentioned above.

The differential amplifier circuit 111 is not only used in the foregoing mixer circuit but also used alone in various circuits to amplify a signal.

FIG. 7 shows a structure of a conventional differential amplifier circuit. The differential amplifier circuit shown in the drawing has the same structure as the differential amplifier circuit 11 in the RF mixer circuit shown in FIG. 6, except that the first bipolar transistor 105 has the collector connected to a first output port 150 and the second bipolar transistor 106 has the collector connected to a second output port 151. Such a conventional differential amplifier circuit is used to amplify a signal for a circuit having a double-balanced configuration, such as the mixer circuit mentioned above.

As described above, an RF frequency inputted to an RF mixer circuit causes therein harmonic signals. Of the harmonic signals, even-order harmonics such as the second and fourth harmonics are cancelled by using a conventional double-balanced RF mixer with excellent symmetry so that even-order distortion is reduced.

On the other hand, odd-order harmonics such as the third and fifth harmonics are not cancelled by the conventional RF mixer circuit and appear in outputs so that it has been impossible to suppress distortion in the outputs caused by the odd-order harmonics. In the odd-order distortion, the third distortion has the largest amplitude, which is the main cause of the distortion. In terms of transistor characteristics, distortion is more likely to occur with higher frequencies so that trouble caused by harmonics are particularly conspicuous with RF frequencies.

Thus, it has been difficult to implement smaller-size and higher-performance communication equipment with the structure of the conventional RF mixer circuit.

The odd-order distortion is caused by the non-linearity between the transistors of the differential amplifier to which an RF signal is inputted. In the differential amplifier circuit 111 to which the RF signal is inputted, therefore, a method of giving a feedback as current outputs by inserting the resistors 202 and 203 in the emitter ends of the first and second bipolar transistors 105 and 106 and thereby reducing the non-linearity.

As a result, the amount of the feedback of the third distortion is increased in proportion to the currents so that the third distortion is reduced.

However, power is consumed in the resistors 202 and 203 so that the effect of reducing signal distortion is limited in design aiming at lower power consumption. Therefore, it has been difficult to simultaneously achieve lower distortion and lower power consumption in the conventional RF mixer circuit.

Since odd-order distortion leads to troubles in equipment when the differential amplifier circuit is used alone, it has been requested to reduce harmonics without increasing power consumption.

SUMMARY OF THE INVENTION

It is therefore an object of the present invention to provide an RF mixer circuit that has been reduced in power consumption and in distortion in the outputs resulting from a harmonic signal and a differential amplifier circuit usable in the RF mixer circuit.

A mixer circuit according to the present invention comprises: a differential amplifier circuit having an RF signal input port for receiving an RF signal; and a double-balanced mixer circuit having a first LO signal input port for receiving an LO signal, a second LO signal input port for receiving an inverted LO signal equal in frequency and amplitude to the LO signal and opposite in phase to the LO signal, a first IF signal output port for outputting an IF signal obtained by mixing the RF signal with the LO signal, and a second IF signal output port for outputting an inverted IF signal equal in frequency and amplitude to the IF signal and opposite in phase to the IF signal, the double-balanced mixer circuit receiving an output signal from the differential amplifier circuit, the differential amplifier circuit having: a first transistor having a control portion for receiving the RF signal inputted to the RF signal input port to output an amplified RF signal in response to the RF signal; a second transistor having a control portion for receiving the inverted RF signal to output an amplified inverted RF signal in response to the inverted RF signal; a capacitor provided between the control portion of the second transistor and a ground; and resonating means connected to each of the RF signal input port, the control portion of the first transistor, and the control portion of the second transistor, the resonating means including the capacitor, the resonating means being provided to reduce a harmonic of the RF signal.

Since the arrangement reduces the harmonic contained in the RF signal when the RF signal is inputted, distortion in the IF signal can be reduced. Since a modulated wave based on the harmonic is reduced, distortion in outputs can also be reduced.

The resonating means is provided such that a frequency of the harmonic of the RF signal becomes a resonance frequency. When the RF signal is inputted, therefore, the harmonic contained in the RF signal and the harmonic contained in the inverted RF signal pass through the resonating means to cancel out each other so that a harmonic component in the amplified RF signal is reduced. As a result, a signal resulting from the harmonic is reduced so that distortion in the IF signal is reduced. Accordingly, the mixer circuit according to the present invention is used particularly preferably in equipment for RF communication.

The resonating means is provided such that a frequency of a third harmonic of the RF signal becomes the resonance frequency. In the arrangement, the third harmonic in the RF signal can be reduced with the differential amplifier circuit and an even-order harmonic can be reduced with the double-balanced mixer so that the harmonic component contained in the IF signal is reduced effectively.

The resonating means further includes a first resistor connected between the capacitor and the control portion of the first transistor. In the arrangement, a resonance circuit undergoes RC resonance and the resonating means allows the passage of a harmonic with a frequency equal to or higher than the resonance frequency. This reduces a plurality of harmonics and thereby reduces distortion in the IF signal. Moreover, an increase in area is suppressed compared with that in the conventional mixer circuit so that a mixer circuit suitable for integration and usable even in communication equipment using an RF frequency exceeding, e.g., several gigahertz is implemented.

The resonating means further includes a first inductor connected between the capacitor and the control portion of the first transistor. In the arrangement, the resonance circuit undergoes LC resonance and the resonating means selectively allows the passage of a harmonic with a frequency around the resonance frequency so that a desired harmonic is reduced. In particular, a third harmonic which has the largest amplitude of all odd-order harmonics can be reduced by using the frequency of the third harmonic as the resonance frequency so that the harmonic component and distortion in the IF signal are reduced. Moreover, an increase in area is suppressed compared with that in the conventional mixer circuit so that a mixer circuit suitable for integration and usable in communication equipment using an RF frequency exceeding, e.g., several gigahertz is implemented.

Each of the first and second transistors is a bipolar transistor, each of the respective control portions of the first and second transistors is a base, the first transistor outputs the amplified RF signal from a collector thereof in response to the RF signal inputted to the base thereof, and the second transistor outputs the amplified inverted RF signal from a collector thereof in response to the inverted RF signal inputted to the base thereof. As a result, a mixer circuit capable of high-speed operation and usable with respect to even an extremely weak RF signal can be implemented.

Each of the first and second transistors is a field effect transistor having a gate, a source, and a drain, each of the respective control portions of the first and second transistors is the gate thereof, the first transistor outputs the amplified RF signal from the drain thereof in response to the RF signal inputted to the gate thereof, and the second transistor outputs the amplified inverted RF signal from the drain thereof in response to the inverted RF signal inputted to the gate thereof. The arrangement allows a reduction in circuit area compared with the case where bipolar transistors are used and provides a mixer circuit suitable for integration.

Alternatively, the differential amplifier circuit has: a first current source connected to the first transistor; a second current source connected to the second transistor; a second resistor connected between the first transistor and the first current source; and a third resistor connected between the second transistor and the second current source. The arrangement further reduces the harmonic of the RF signal and reduces the nonlineality between the amplified RF signal and the inverted amplified RF signal. As a result, a mixer circuit equal in power consumption to the conventional mixer circuit and lower in distortion in the outputs than the conventional mixer circuit can be implemented.

Alternatively, the differential amplifier circuit has: a first current source connected to the first transistor; a second current source connected to the second transistor; a second inductor connected between the first transistor and the first current source; and a third inductor connected between the second transistor and the second current source. The arrangement reduces noise contained in the amplified RF signal and reduces the nonlinearity of the output of the differential amplifier circuit. Since the power consumption of an inductor is lower than that of a resistor, power consumption can also be reduced compared with that of the conventional mixer circuit.

The first and second current sources may be the same current source.

Preferably, the RF signal has a frequency of 0.8 GHz or more. This is because distortion in the transistor composing the mixer circuit presents a more serious problem with a higher frequency. By setting the frequency of the RF signal to 0.8 GHz or more, the mixer circuit of the present invention can be used preferably in communication equipment such as mobile phone.

A differential amplifier circuit according to the present invention comprises: an RF signal input port for receiving an RF signal; a first transistor having a control portion for receiving the RF signal inputted to the RF signal input port to output an amplified RF signal in response to the RF signal; a second transistor having a control portion for receiving an inverted RF signal opposite in phase to the RF signal to output an amplified inverted RF signal in response to the inverted RF signal; a capacitor provided between the control portion of the second transistor and a ground; and resonating means connected to each of the RF signal input port, the control portion of the first transistor, and the control portion of the second transistor, the resonating means including the capacitor, the resonating means being provided to reduce a harmonic of the RF signal.

In the arrangement, the resonating means is provided to reduce the harmonic of the RF signal so that a signal resulting from the harmonic is reduced and distortion in the amplified RF signal and in the inverted RF signal is reduced.

The resonating means is provided such that a frequency of the harmonic of the RF signal becomes a resonance frequency. Consequently, the harmonic contained in the RF signal and the harmonic contained in the inverted RF signal pass through the resonating means to cancel out each other so that a harmonic component in the amplified RF signal is reduced. As a result, a signal resulting from the harmonic is reduced so that distortion in the amplified RF signal and in the inverted RF signal is reduced. Accordingly, the differential amplifier circuit according to the present invention is used not only in a double-balanced mixer circuit used in equipment for RF communication but also in various devices using extremely small signals.

The resonating means is provided such that a frequency of a third harmonic of the RF signal becomes the resonance frequency. The arrangement reduces a third harmonic component and distortion in the amplified RF signal. Since the third harmonic component in the output is reduced, the differential amplifier circuit according to the present invention is used preferably as part of a double-balanced mixer circuit.

The resonating means further includes a first resistor connected between the capacitor and the control portion of the first transistor. In the arrangement, a resonance circuit undergoes RC resonance and the resonating means allows the passage of a harmonic with a frequency equal to or higher than the resonance frequency. This reduces a plurality of harmonics, thereby reduces distortion in the outputs, and improves the linearity of the output. Moreover, an increase in area is suppressed compared with that in the conventional differential amplifier circuit so that a differential amplifier circuit suitable for integration and usable even in communication equipment using an RF frequency exceeding, e.g., several gigahertz is implemented.

The resonating means further includes a first inductor connected between the capacitor and the control portion of the first transistor. In the arrangement, the resonance circuit undergoes LC resonance and the resonating means selectively allows the passage of a harmonic with a frequency around the resonance frequency so that a desired harmonic in the amplified RF signal is reduced. In particular, a third harmonic which has the largest amplitude of all odd-order harmonics can be reduced by using the frequency of the third harmonic as the resonance frequency so that distortion in the outputs is reduced. Moreover, an increase in area is suppressed compared with that in the conventional differential amplifier circuit so that the differential amplifier circuit according to the present invention is suitable for integration. Accordingly, the differential amplifier circuit of the present invention can compose a mixer circuit usable in equipment for RF communication using an RF frequency exceeding, e.g., several gigahertz when it is combined with a double-balanced mixer circuit.

Each of the first and second transistors is a bipolar transistor, each of the respective control portions of the first and second transistors is a base, the first transistor outputs the amplified RF signal from a collector thereof in response to the RF signal inputted to the base thereof, and the second transistor outputs the amplified inverted RF signal from a collector thereof in response to the inverted RF signal inputted to the base thereof. As a result, a differential amplifier circuit capable of operating at a high speed and outputting the amplified RF signal and the amplified inverted RF signal in response to even an extremely weak RF signal can be implemented.

Each of the first and second transistors is a field effect transistor having a gate, a source, and a drain, each of the respective control portions of the first and second transistors is the gate thereof, the first transistor outputs the amplified RF signal from the drain thereof in response to the RF signal inputted to the gate thereof, and the second transistor outputs the amplified inverted RF signal from the drain thereof in response to the inverted RF signal inputted to the gate thereof. The arrangement allows a reduction in circuit area compared with the case where bipolar transistors are used and provides a differential amplifier circuit suitable for integration.

The differential amplifier circuit has: a first current source connected to the first transistor; a second current source connected to the second transistor; a second resistor connected between the first transistor and the first current source; and a third resistor connected between the second transistor and the second current source. The arrangement further reduces the harmonic of the RF signal and reduces the non-linearity of the output. In addition, the power consumption of the differential amplifier circuit according to the present invention is as low as that of the conventional differential amplifier circuit.

The differential amplifier circuit has: a first current source connected to the first transistor; a second current source connected to the second transistor; a second inductor connected between the first transistor and the first current source; and a third inductor connected between the second transistor and the second current source. The arrangement reduces noise contained in the amplified RF signal and reduces the non-linearity of the output. Since the power consumption of an inductor is lower than that of a resistor, power consumption can also be reduced compared with that of the conventional differential amplifier circuit.

The first and second current sources may be the same current source.

The RF signal has a frequency of 0.8 GHz or more. The arrangement allows the differential amplifier circuit according to the present invention to be used preferably in communication equipment such as mobile phone.

DETAILED DESCRIPTION OF THE INVENTION

Embodiment 1

Figure 1:
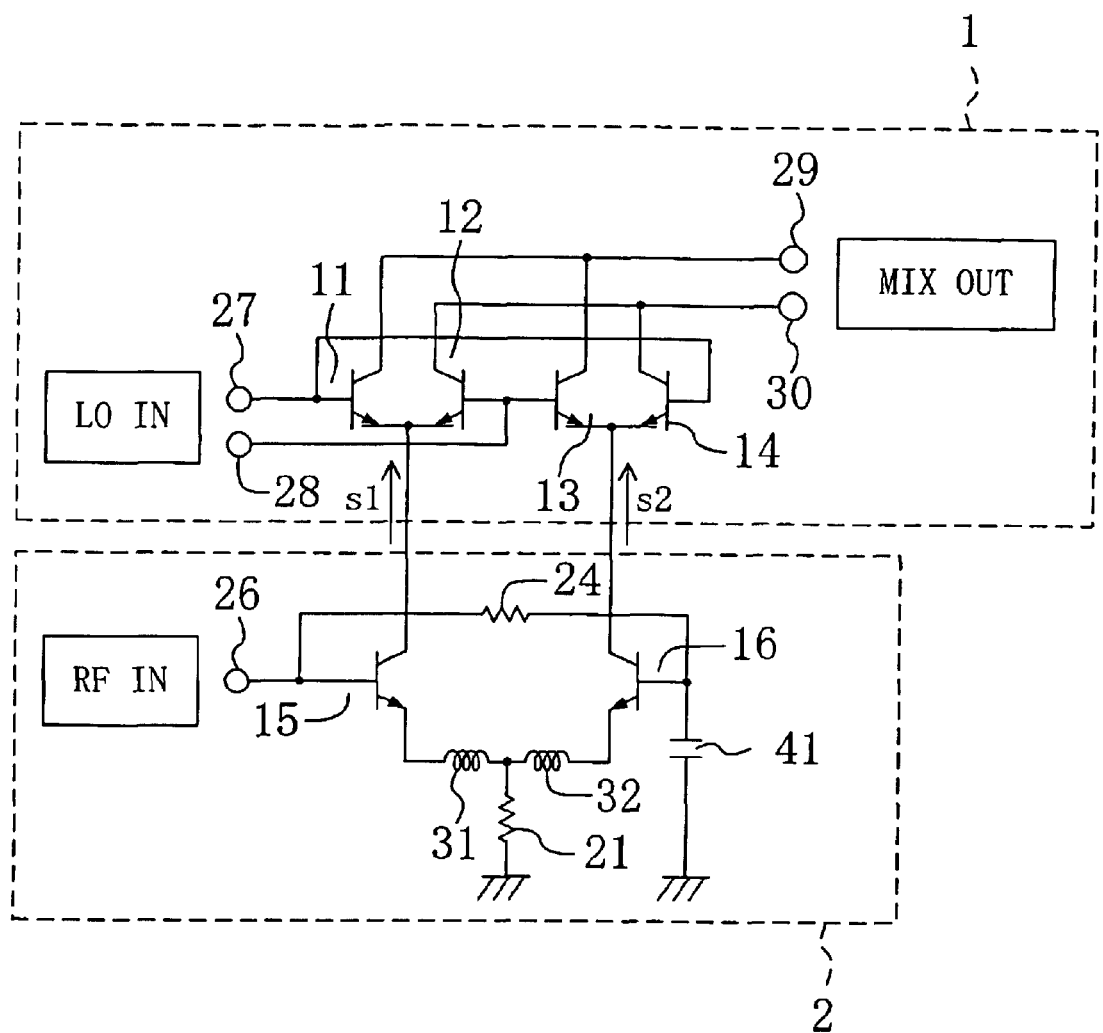
FIG. 1 is a circuit diagram showing a structure of an RF mixer circuit according to a first embodiment of the present invention.

FIG. 1 is a circuit diagram showing a structure of an RF mixer circuit according to a first embodiment of the present invention.

As shown in the drawing, the RF mixer circuit according to the present embodiment is composed of a differential amplifier circuit 2 and a double-balanced mixer circuit (DBM circuit) 1 connected to the differential amplifier circuit 2.

When an RF signal is inputted to the differential amplifier circuit 2 and an LO signal and an inverted LO signal opposite in phase to the LO signal are inputted to the DBM circuit 1 in the RF mixer circuit according to the present embodiment, these signals are mixed with each other in the DBM circuit 1 so that an IF signal as a mixed signal of the RF signal and the LO signals is outputted in the same manner as in the conventional RF mixer circuit.

In the RF mixer circuit according to the present embodiment, harmonic components contained in the outputs of the differential amplifier circuit 2 have been reduced compared with those in the conventional RF mixer circuit so that harmonic components in the outputs of the DBM circuit 1 have also been reduced. The effect will be described in detail after the description of the circuit structure.

A detailed description will be given herein below to the RF mixer circuit according to the present embodiment.

In the RF mixer circuit according to the present embodiment, the DBM circuit 1 has the same structure as the conventional RF mixer circuit, while the differential amplifier circuit 2 has a structure different from that of the conventional differential amplifier circuit.

The differential amplifier circuit 2 has: a first bipolar transistor 15; a second bipolar transistor having a base connected to the base of the first bipolar transistor 15; and an RF signal input port 26 connected to each of the respective bases of the first and second bipolar transistors 15 and 16.

The differential amplifier circuit 2 further has: a first resistor 24 connected between the respective bases of the first and second bipolar transistors 15 and 16; a capacitor 41 having one end connected to the first resistor 24 and to the base of the second bipolar transistor 16 and the other end connected to the ground; a first inductor 31 connected to the emitter of the first bipolar transistor 15; a second inductor 32 having one end connected to the emitter of the second bipolar transistor 16 and the other end connected to the first inductor; and a current source composed of a grounded second resistor 21 which is connected between the first and second inductors 31 and 32.

Since the RF mixer circuit according to the present embodiment is used primarily in communication equipment using RF frequencies, an RF frequency of 0.8 GHz or more is inputted to the input port of the differential amplifier circuit.

The DBM circuit 1 has third and fourth bipolar transistors 11 and 12 having respective emitters connected to each other, fifth and sixth bipolar transistors 13 and 14 having respective emitters connected to each other, a first LO signal input port 27, a second LO signal input port 28, a first IF signal output port 29, and a second IF signal output port 30. The respective bases of the third and sixth bipolar transistors 11 and 14 are connected to each other and also connected to the first LO signal input port 27. The respective bases of the fourth and fifth bipolar transistors 12 and 13 are connected to each other and also connected to the second LO signal input port 28.

The RF mixer according to the present embodiment is characterized in that the capacitor 41 connected to each of the RF signal input port 26 and the base of the second bipolar transistor 16 and also to the ground and the first resistor 24 connected to the capacitor 41 are provided. In the RF mixer according to the present embodiment, in particular, the first resistor 24 and the capacitor 41 have been designed to provide connection between the respective bases of the first and second transistors 15 and 16 such that the circuit containing the first resistor 24 and the capacitor 41 resonates with the frequency of the third harmonic of the RF signal. For example, the resistance value of the first resistor 24 is 400 Ω and the capacitance value of the capacitor 41 is 10 pF in the present embodiment. Such resonance caused by a resistor and a capacitor is generally termed RC resonance. Conditions for the RC resonance is given by $f=\frac{1}{2\pi}CR$ if the frequency of the inputted third harmonic signal is f, the resistance value of the first resistor 24 is R, and the capacitance value of the capacitor 41 is C.

In the RF mixer according to the present embodiment, the first and second inductors 31 and 32 are connected, in place of the resistors, to the respective emitters of the first and second bipolar transistors 15 and 16.

A description will be given to a circuit operation in the RF mixer according to the present embodiment.

When a single-phase RF signal is inputted first to the RF signal input port 26, an RF signal with a frequency $f_1$ is inputted to the base of the first bipolar transistor 15. On the other hand, the phase of the RF signal is rotated by 180 degrees by the capacitor 41 so that the inverted RF signal with the frequency $f_1$ is inputted to the base of the second bipolar transistor 16.

It is to be noted that the first and second bipolar transistors 15 and 16 have been designed to have equal characteristics, while the first and second inductors 31 and 32 have been designed to have equal characteristics. Accordingly, signals s1 and s2 each having the frequency $f_1$, amplified, and having a 180° phase shift therebetween are outputted from the respective collectors of the first and second bipolar transistors 15 and 16.

Since the first resistor 24 and the capacitor 41 connected in series to each other relative to the ground have been designed to cause RC resonance by using the frequency $3f_1$ of the third harmonic of the RF signal as a resonance frequency, the third and higher-order harmonic signals contained in the RF signal can be reduced. This is because the first resistor 24 and the capacitor 41 become lower in impedance in response to a signal at a higher frequency under the conditions for the RC resonance and therefore the third and higher-order harmonics of the RF signal and the harmonics of the inverted RF signal are cancelled out. As a result, the third and higher-order harmonics can effectively be reduced and harmonics contained in the signals s1 and s2 can also be reduced. Accordingly, distortion contained in the signals s1 and s2 is also reduced.

In addition, the base of the second bipolar transistor 16 is grounded in a high frequency manner via the capacitor 41 so that power consumption is reduced compared with the case where the base is directly grounded.

Since the number of elements of the differential amplifier circuit 2 with the extra resistor is larger only by one than that of the conventional differential amplifier circuit, the increase in area circuit has been reduced.

Moreover, the harmonics have been reduced in the RF mixer circuit according to the present embodiment so that it is no more necessary to connect respective resistors to the emitters of the first and second bipolar transistors 15 and 16. Furthermore, the first and second inductors 31 and 32 are used instead of the resistors, noise contained in the outputs of the differential amplifier circuit has been reduced and power loss has also been reduced compared with those in the conventional RF mixer circuit. In addition, the linearity of the output of the differential amplifier circuit 2 has been improved.

On the other hand, a balanced signal (the inverted LO signal) having the same amplitude as the LO signal outputted from a local oscillator and a 180° phase difference between itself and the LO signal is generated from the LO signal via a balun.

When the signals s1 and s2 and the LO signals each having a frequency $f_2$ (the non-inverted LO signal and the inverted LO signal) are inputted to the DBM circuit 1, IF signals having a 180° phase shift therebetween are outputted from the first and second IF signal output ports 29 and 30, respectively.

Since the pair of transistors composed of the third and fourth bipolar transistors 11 and 12 and the pair of transistors composed of the fifth and sixth bipolar transistors 13 and 14 have been designed to have equal characteristics including impedance and the individual transistors forming each of the pairs of transistors have also been designed to have equal characteristics, even numbered modulated waves are cancelled out and the modulated wave components of the harmonics contained in the IF signals are minimized. Since the third and higher-order harmonics contained in the output from the differential amplifier circuit 2 have already been reduced, the third and higher-order modulated waves contained in the IF signals have been greatly reduced compared with those in the conventional differential amplifier circuit, whether they are even-order or odd-order. Accordingly, distortion caused by harmonics has also been minimized. A third modulated wave used herein indicates a signal obtained by modulating a third harmonic by using the mixer circuit.

Thus, the RF mixer circuit according to the present embodiment has reduced distortion in the outputs compared with the conventional RF mixer circuit so that it is preferably used in communication equipment used in, e.g., RF communication. Since the RF mixer circuit according to the present embodiment has been reduced in power consumption and distortion, it can be used particularly preferably in equipment using RF frequencies of 0.8 GHz or more such as current mobile phone, equipment for wideband CDMA (using the 2 GHz range), and equipment for wireless LAN (using the 5 GHz range). The RF mixer circuit according to the present embodiment also contributes more to a reduction in the size of communication equipment and an improvement in the performance thereof than the conventional RF mixer circuit.

Although an input signal at a frequency lower than 0.8 GHz can also be inputted to the mixer circuit according to the present embodiment, an input signal preferably has a higher frequency such that effect of reducing distortion using RC resonance is maximally achieved.

The RF mixer circuit according to the present embodiment is also suitable for integration since the increase in area thereof is smaller than that of the conventional RF mixer circuit.

A further description will be given herein below to the effects of the RF mixer circuit according to the present embodiment by using the result of simulation.

Figure 2:
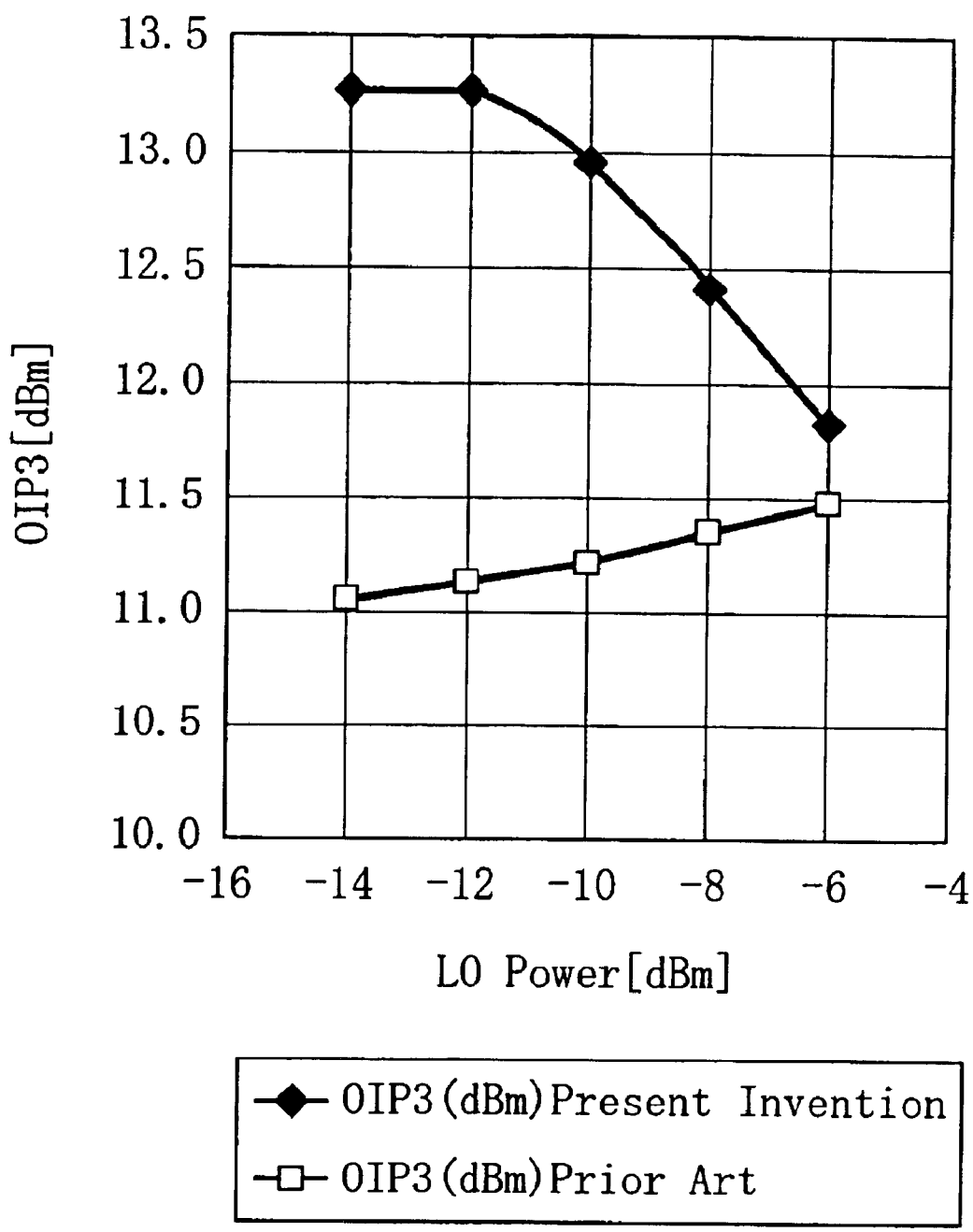
FIG. 2 is a view for comparison between the respective distortion properties of the RF mixer circuit according to the first embodiment and a conventional mixer circuit.

FIG. 2 is a view for comparison between the respective performances of the RF mixer circuit according to the present invention and the conventional mixer circuit, which shows the result of simulating the relationship between the intercept points (OIP3) of the outputs of the mixer circuits and the power of the LO signal.

Figure 3:
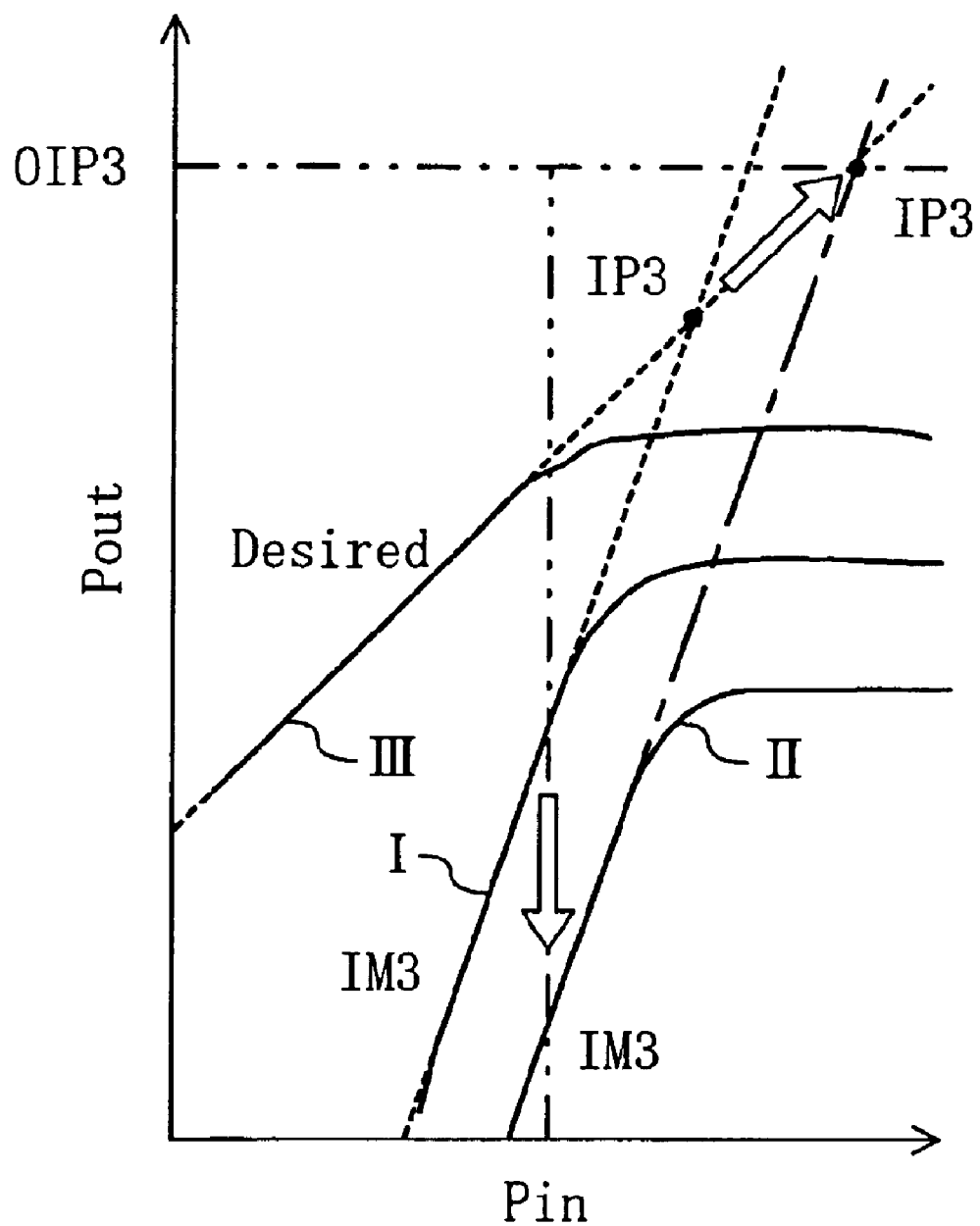
FIG. 3 is a graph showing a relationship between the input power ($P_{IN}$) of an RF signal and the output power ($P_{OUT}$) of an IF signal in the RF mixer circuits.

FIG. 3 is a graph showing the relationship between the input power ($P_{IN}$) of the RF signal and the output power ($P_{OUT}$) of the IF signal.

The intercept point (OIP3) of the output is one of parameters for evaluating distortion. A larger intercept point indicates lower distortion. For the power $P_{OIP3}$ of the intercept point OIP3, the relationship represented by the following expression (1) is established:

$$P_{OIP3}=(3P_{out}-P_{IM3})/2 \qquad (1)$$

where $P_{out}$ is the output power of the IF signal and $P_{IM3}$ is the output power of a third modulated wave. It is assumed that dBm is the unit of each power.

The result of simulation shown in FIG. 2 was obtained when two signals with 2.14 GHz and with 2.141 GHz were inputted as RF signals and a signal with 2.419 GHz was inputted as an LO signal so that a signal with 279 MHz was obtained as a result of conversion. The reason for simultaneously inputting the signal with 2.14 GHz and the signal with 2.141 GHz is that a third harmonic is produced intentionally and the influence thereof is observed more easily.

From FIG. 2, it can be seen that the RF mixer circuit according to the present invention has a larger intercept point OIP3 than the conventional RF mixer circuit in each of the power ranges of the simulated LO signal. In short, the RF mixer circuit according to the present embodiment more greatly reduces distortion in the IF signal. It is to be noted that power in an actual operating state is about −10 dBm.

As the power of the LO signal increases, the intercept point OIP3 decreases in the RF mixer circuit according to the present invention, while the intercept point OIP3 increases in the conventional RF mixer circuit. This indicates that distortion in the outputs can be reduced more effectively than in the conventional RF mixer circuit as the power of the LO signal is reduced for lower power consumption. Although FIG. 2 shows the result of simulation only for the third modulated wave, the third modulated wave in the IF output can be reduced by setting the resonance frequency of RC resonance to the frequency of a third harmonic because the third modulated wave has the largest amplitude of all the odd numbered harmonics. Since it is obvious that higher-order modulated waves have also been reduced, it may be considered that distortion in the outputs has been reduced with the RF mixer circuit according to the present embodiment.

A description will be given herein below to the reason why the intercept point OIP3 serves as a parameter for distortion in the outputs by using the result of simulation.

In FIG. 3, the lines I and II, e.g., show the respective input/output characteristics of harmonics caused by third distortion in the RF mixer circuit according to the present embodiment and in the conventional RF mixer circuit, while the line III shows the input/output characteristics of a desired wave in the output. The lines I and II indicate the respective output powers PIM3 of third modulated waves in the different RF mixer circuits. Under the conditions used for simulation the result of which is shown in FIG. 2, a desired wave in the output has a frequency of 270 MHz and a third modulated wave signal caused by third distortion has a frequency of 280 MHz.

When the power is represented in dBm, the input power of the RF signal is proportional to the output power of the desired wave and the gradient of the line III indicative of changes in the output power of the desired wave is 1 in the range in which the input power PIN is low. The gradient of each of the lines I and II indicative of changes in output power $P_{IM3}$ is 3 when the input power $P_{IN}$ is in a given range.

If the gradient of each of the lines I to III is extrapolated to the range beyond the range in which the input power $P_{IN}$ is proportional to the output power POUT, the lines III and each of the lines I and II inevitably have the point of intersection IP3. The value of the output power $P_{OUT}$ at the point of intersection IP3 is OIP3, while the value of the input power $P_{IN}$ at the point of intersection IP3 is IIP3.

If a comparison is made between the characteristics of the conventional RF mixer circuit indicated by the line I and the characteristics of the RF mixer circuit according to the present embodiment indicated by the line II, the output power $P_{IM3}$ responsive to the same input power $P_{IN}$ is lower in the RF mixer circuit according to the present embodiment. Accordingly, the values OIP3 and IP3 are larger in the RF mixer circuit according to the present embodiment having smaller modulated wave components in the output. Under the conditions for simulation the result of which is shown in FIG. 2, the value OIP3, conversion gain, and power consumption of the RF mixer circuit according to the present embodiment are 13.0 dBm, 12.1 dBm, and 5.1 mA, respectively, when the input power $P_{IN}$ of the RF signal is −30 dBm, the input power of the LO signal is −10 dBm, and a power supply voltage is 2.8 V. By contrast, the value OIP3 of the conventional RF mixer circuit is 11.2 dBm. In short, the value OIP3 is higher by about 2.0 dBm in the RF mixer circuit according to the present embodiment than in the conventional RF mixer circuit.

Thus, the value OIP3 is higher in a mixer circuit having smaller harmonic components resulting from third distortion. Accordingly, distortion in the outputs is smaller as the value OIP3 is larger so that the value OIP3 serves as a parameter for distortion.

Hence, it can be said that odd-order harmonic signals have been reduced and distortion in the outputs has also be reduced in the RF mixer circuit according to the present invention compared with those in the conventional RF mixer circuit.

Although the first and second inductors 31 and 32 have been provided in the RF mixer circuit according to the present embodiment to reduce noise and power consumption, these inductors may also be replaced with resistors in the same manner as in the conventional RF mixer circuit. In this case, modulated wave components in the output can further be reduced since each of the lines III and II shown in FIG. 3 moves downward in parallel.

Although the RF mixer circuit according to the present embodiment has used the npn-type bipolar transistors, the same effect is achievable if pnp-type bipolar transistors are used.

If field effect transistors are used in place of the first and second bipolar transistors 15 and 16 in the RF mixer circuit according to the present embodiment, it also functions as a mixer circuit in which distortion has been reduced. In this case, a circuit area can further be reduced advantageously for integration.

In the case of using the RF mixer circuit according to the present invention in communication equipment using extremely weak signals, however, the structure of the present embodiment shown in FIG. 1 is particularly preferred because a bipolar transistor is capable of higher-speed operation and has a higher ability to amplify a signal.

There are also cases where the first and second inductors 31 and 32 are not provided.

Although the RF mixer circuit according to the present embodiment has set the resonance frequency of RF resonance to the frequency of the third harmonic of the RF signal, the resonance frequency may also be set to the frequency of the second harmonic of the RF signal. This reduces the second and higher-order harmonics contained in the output signal of the differential amplifier circuit 2.

Although the RF mixer circuit according to the present embodiment is used preferably in equipment using a frequency of 0.8 GHz or more as described above, it may also be used at a frequency under 0.8 GHz.

Although the first and second inductors 31 and 32 are connected to the same current source in the RF mixer circuit according to the present embodiment, they may also be connected to different current sources individually.

Since the RF mixer circuit according to the present embodiment is characterized by the differential amplifier circuit 2, an RF mixer circuit with reduced distortion can be implemented even in combination with a DBM circuit having a structure other than that shown in FIG. 1.

Of the RF mixer circuit according to the present embodiment, the differential amplifier circuit 2 may also be used alone as an independent differential amplifier circuit. In this case, the differential amplifier circuit 2 is used particularly preferably in equipment using RF frequencies, which will be described in detail in the subsequent embodiment.

Embodiment 2

Figure 4:
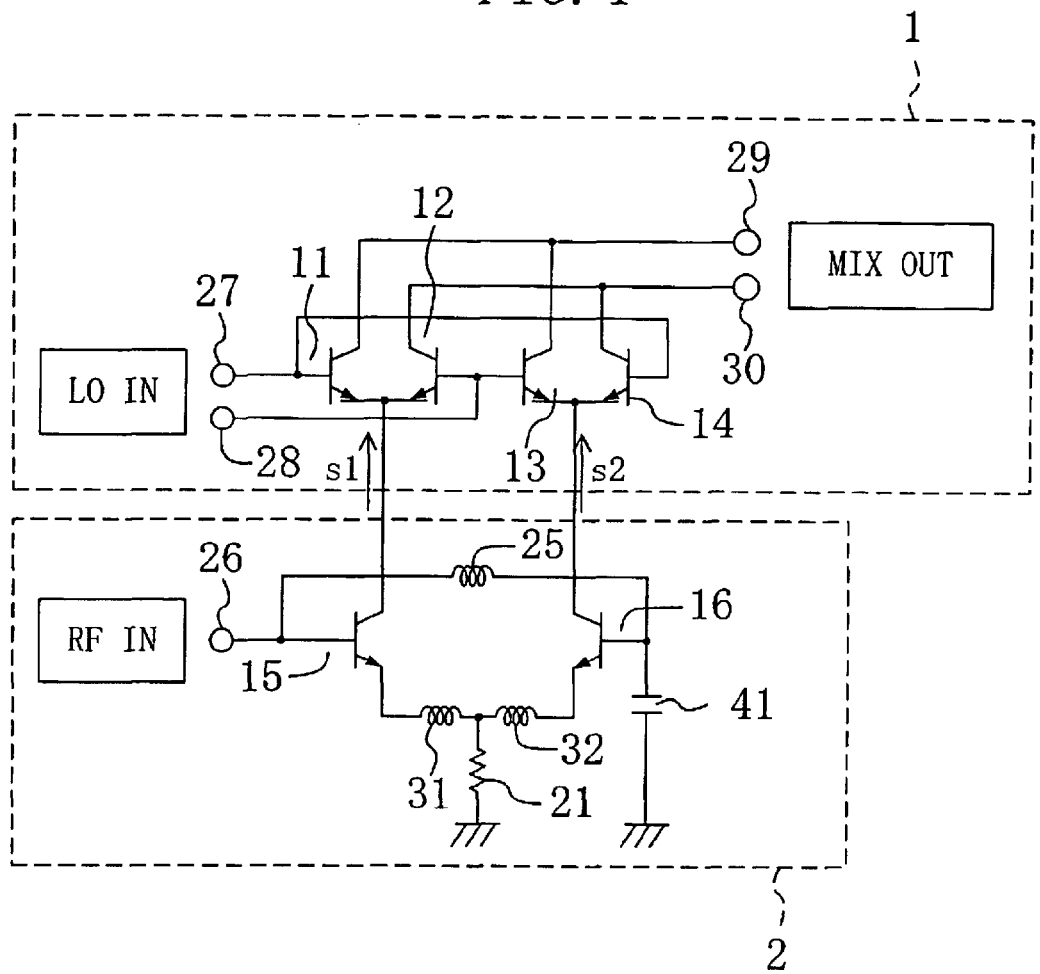
FIG. 4 is a circuit diagram showing a structure of an RF mixer circuit according to a second embodiment of the present invention.

FIG. 4 is a circuit diagram showing a structure of an RF mixer circuit according to a second embodiment of the present embodiment.

As shown in the drawing, the RF mixer circuit according to the present embodiment is different from the RF mixer circuit according to the first embodiment in that a third inductor 25 is provided in place of the first resistor 24 (see FIG. 1). As for the other circuit components, they are the same as those used in the first embodiment.

Briefly, the RF mixer circuit according to the present embodiment is composed of a DBM circuit 1 having the same structure as that of each of the conventional and first embodiments and of a differential amplifier circuit 2.

The differential amplifier circuit 2 has: first and second bipolar transistors 15 and 16 having respective bases to which RF signals having a 180° phase shift therebetween are inputted; first and second inductors 31 and 32 connected to the respective emitters of the first and second bipolar transistors 15 and 16; a current source connected to a wire connecting the first and second inductors 31 and 32; the third inductor 25 connected between the respective bases of the first and second bipolar transistors 15 and 16; and a capacitor 41 having one electrode grounded and the other electrode connected to the third inductor 25. The second bipolar transistor 16 has a base grounded in a high frequency manner via the capacitor 41.

The present embodiment is characterized in that the third inductor 25 is provided in place of the first resistor 24 (see FIG. 1). The third inductor 25 and the capacitor 41 have been designed to provide connection between the respective bases of the first and second bipolar transistors 15 and 16 such that the circuit containing the third inductor 25 and the capacitor 41 undergoes LC resonance. The resonance frequency of the LC resonance is adjusted to the frequency $3f_1$ of the third harmonic of the RF signal. The LC resonance is defined herein as the resonance between an inductor and a capacitor. Under this condition, the inductor and the capacitor selectively allow the passage of an electric wave with a specified frequency (which is the third harmonic of the RF signal in the present embodiment).

Accordingly, the following expression (2) is satisfied in the RF mixer circuit according to the present embodiment:

$$3f_1 = \frac{1}{2\pi}\sqrt{(LC)} \qquad (2).$$

The circuit which undergoes the RC resonance becomes lower in impedance in response to a signal with a frequency equal to or higher than the resonance frequency, while it becomes lower in impedance selectively in response to a signal with the resonance frequency. In the RF mixer circuit according to the present embodiment, therefore, the third harmonic selectively passes through the third inductor 25 and the capacitor 41 so that the third harmonic contained in the non-inverted RF signal and the third harmonic contained in the inverted RF signal are cancelled out. Consequently, distortion in the outputs of the differential amplifier circuit 2 is reduced. The distortion in the outputs of the differential amplifier circuit 2 which is lower than in the conventional differential amplifier circuit also reduces distortion in the outputs (IF signals) of the RF mixer circuit.

If a comparison is made between the present embodiment and the RF mixer circuit according to the first embodiment, the frequency which is allowed to pass more easily by the LC resonance is selective so that the RF mixer circuit according to the present embodiment is suitable for an order-made circuit which is used for a specified application. Since the RF mixer circuit according to the present embodiment is effective even in the case where the frequency is lower than in the case where the RC resonance is utilized, the effect of reducing distortion is achievable even in the case where the frequency of the input signal is lower than 0.8 GHz.

Thus, the RF mixer circuit according to the present embodiment has been reduced in signals resulting from harmonics in the output thereof compared with the conventional RF mixer circuit so that it is used preferably in higher-performance equipment for RF communication.

Since the RF mixer circuit according to the present embodiment has only one more inductor than the conventional RF mixer circuit, an increase in the area of the RF mixer circuit according to the present embodiment is smaller than that of the conventional RF mixer circuit, which is also preferable in terms of circuit integration.

Since the first and second inductors 31 and 32 are also connected to the respective emitters of the first and second bipolar transistors 15 and 16 in the RF mixer circuit according to the present embodiment in the same manner as in the first embodiment, noise and power consumption have been reduced compared with those in the conventional RF mixer circuit.

It is to be noted that each of the first and second inductors 31 and 32 may also be replaced with a resistor.

It is also possible to use field effect transistors in place of the first and second bipolar transistors 15 and 16 in the RF mixer circuit according to the present embodiment in the same manner as in the first embodiment. Alternatively, pnp-type bipolar transistors may also be used instead.

Embodiment 3

As a third embodiment of the present invention, a differential amplifier circuit which outputs an amplified signal in response to an inverted input signal opposite in phase to an input signal will be described.

Figure 5:
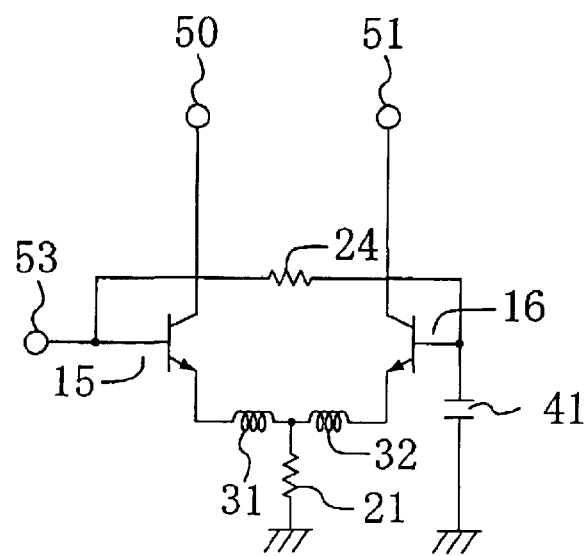
FIG. 5 is a circuit diagram showing a structure of a differential amplifier circuit according to a third embodiment of the present invention.
Figure 6:
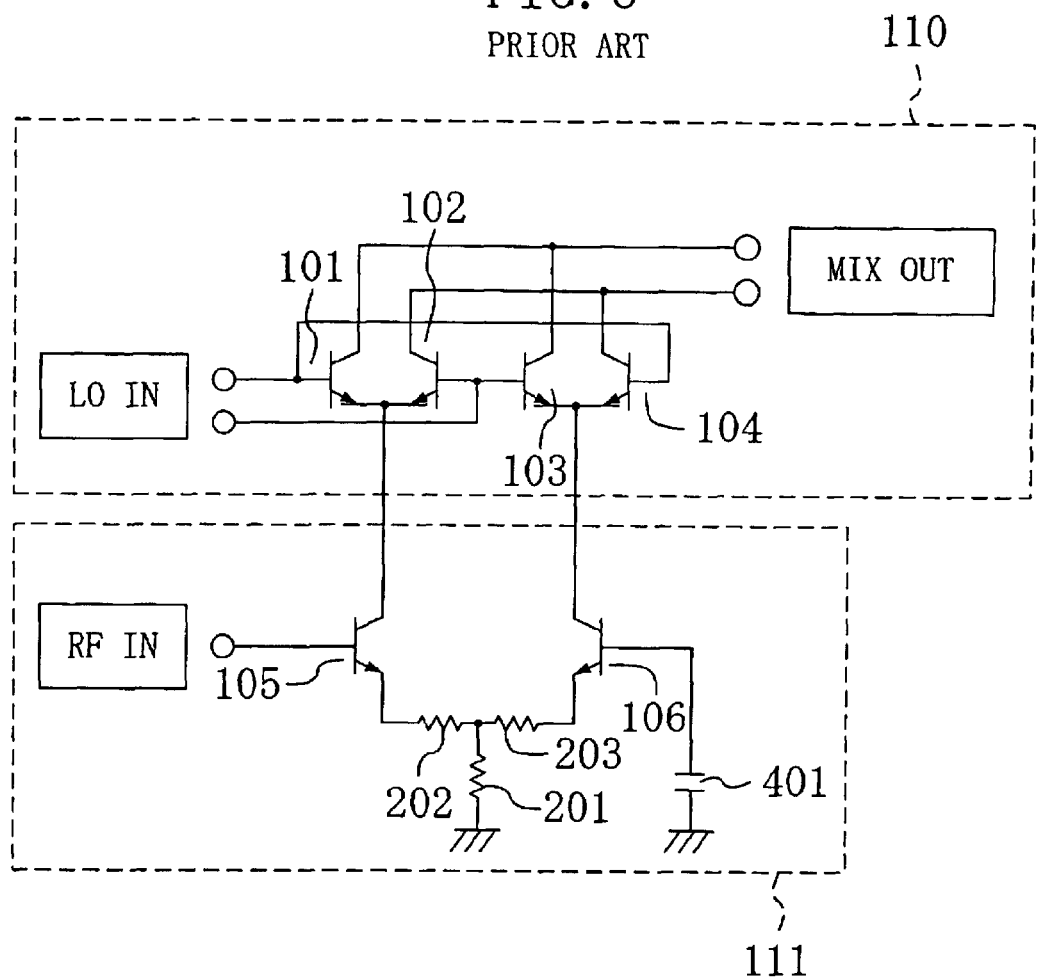
FIG. 6 is a circuit diagram showing a structure of a conventional double-balanced RF mixer circuit.
Figure 7:
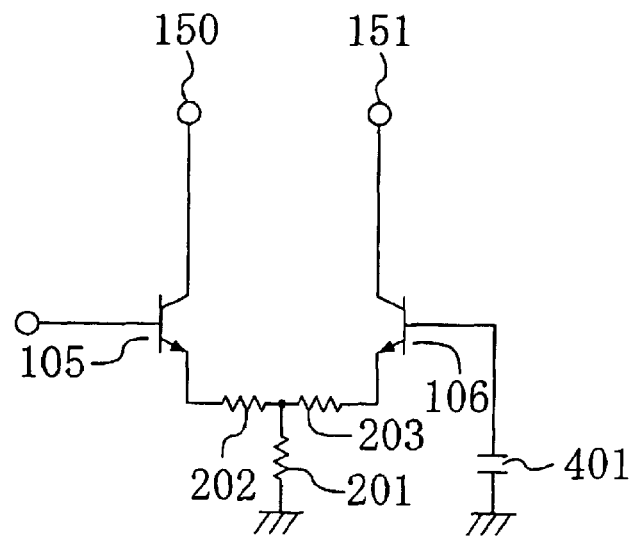
FIG. 7 is a view showing a structure of the conventional differential amplifier circuit.

FIG. 5 is a circuit diagram showing a structure of the differential amplifier circuit according to the present embodiment. As shown in the drawing, the differential amplifier circuit according to the present embodiment is identical to the differential amplifier circuit 2 (see FIG. 1) in the RF mixer circuit according to the first embodiment. The RF signal input port 26 according to the first embodiment is replaced with an input port 53 in the present embodiment. In addition, output ports 50 and 51 for outputting signals are provided.

The differential amplifier circuit according to the present embodiment has: first and second bipolar transistors 15 and 16 having respective bases connected to each other; and the input port 53 connected to each of the respective bases of the first and second bipolar transistors 15 and 16. The differential amplifier circuit further has: a first resistor 24 connected between the respective bases of the first and second bipolar transistors 15 and 16; a capacitor 41 having one end connected to the first resistor 24 and to the base of the second bipolar transistor 16 and the other end connected to the ground; a first inductor 31 connected to the emitter of the first bipolar transistor 15; a second inductor 32 having one end connected to the emitter of the second bipolar transistor 16 and the other end connected to the first inductor 31; a current source connected to a wire connecting the first and second inductors 31 and 32 and composed of a grounded second resistor 21; the output port 50 connected to the collector of the first bipolar transistor 15; and the output port 51 connected to the collector of the second bipolar transistor 16.

If an RF frequency is inputted to the input port 53, the base of the second bipolar transistor 16 is grounded in a high frequency manner via the capacitor 41.

The first resistor 24 and the capacitor 41 have been designed to provide connection between the respective bases of the first and second bipolar transistors 15 and 16 such that the circuit containing the first resistor 24 and the grounded capacitor 41 functions as an RC resonance circuit in response to the frequency of the third harmonic of the input signal.

A description will be given to the operation of the differential amplifier circuit according to the present embodiment, which is the same as the operation of the differential amplifier circuit described in the first embodiment.

Specifically, if an input signal at a frequency f, is inputted to the input port 53, the non-inverted and inverted input signals are applied to the respective bases of the first and second bipolar transistors 15 and 16. Since the circuit containing the first resistor 24 and the capacitor 41 are brought into the state of RC resonance in response to the frequency $3f_1$ of the third harmonic, the third and higher-order harmonics contained in the inverted input signal opposite in phase to the input signal pass through the first resistor 24 to be cancelled.

Consequently, the respective operation cycles of the first and second bipolar transistors 15 and 16 become exactly opposite to each other so that signals each having a frequency $f_1$ and an amplified amplitude and having a 180° phase shift therebetween are outputted from the output ports 50 and 51, respectively. Since the differential amplifier circuit according to the present embodiment has reduced harmonics in the input signals thereof, the harmonic components and distortion contained in the output signals thereof are reduced compared with those in the conventional differential amplifier circuit.

Moreover, since an increase in the area of the differential amplifier circuit according to the present embodiment is smaller than that of the conventional differential amplifier circuit, higher-density integration is achievable.

Since the differential amplifier circuit according to the present embodiment uses the first and second inductors 31 and 32 in place of resistors, the noise and power consumption thereof are reduced compared with those of the conventional differential amplifier circuit.

If a further reduction in harmonics is preferred to a reduction in power consumption, resistors may also be used in place of the first and second inductors 31 and 32. There are also cases where it is unnecessary to connect a resistor or an inductor to the emitter of each of the first and second transistors 15 and 16.

Since the differential amplifier circuit according to the present embodiment is thus capable to outputting balanced signals having reduced distortion resulting from odd-order harmonics in response to a single-phase input signal, it can be used preferably to compose a double-balanced RF mixer circuit in combination with a DBM circuit. The differential amplifier circuit according to the present embodiment can also be used preferably in a double-balanced RF circuit capable of reducing a second harmonic.

Moreover, the differential amplifier circuit according to the present embodiment can also be used preferably in various devices such as an amplifier (LNA) or a local amplifier in order to amplify an extremely weak signal. In this case, it is also effective to set the resonance frequency of the first resistor 24 and the capacitor 41 to the second harmonic $3f_1$ of the input signal. This entirely reduces the third and higher-order harmonics in the outputs.

Although the present embodiment has described the differential amplifier circuit utilizing RC resonance, a differential amplifier circuit utilizing LC resonance may also be used for the amplification of a signal, similarly to the differential amplifier circuit described in the second embodiment. In this case, it is preferable to design a circuit such that the frequency of a harmonic intended to be reduced most preferentially is used as the resonance frequency of the LC resonance.

In the differential amplifier circuit according to the present embodiment, pnp-type bipolar transistors may also be used in place of the npn-type bipolar transistors.

It is also possible to use field effect transistors in place of the bipolar transistors.

What is claimed is:

1. A mixer circuit comprising:

a differential amplifier circuit having an RF signal input port for receiving an RF signal; and a double-balanced mixer circuit having a first LO signal input port for receiving an LO signal, a second LO signal input port for receiving an inverted LO signal equal in frequency and amplitude to the LO signal and opposite in phase to the LO signal, a first IF signal output port for outputting an IF signal obtained by mixing the RF signal with the LO signal, and a second IF signal output port for outputting an inverted IF signal equal in frequency and amplitude to the IF signal and opposite in phase to the IF signal, the double-balanced mixer circuit receiving an output signal from the differential amplifier circuit, the differential amplifier circuit having:

a first transistor having a control portion for receiving the RF signal inputted to the RF signal input port to output an amplified RF signal in response to the RF signal;

a second transistor having a control portion for receiving a virtual inverted RF signal to output an amplified inverted RF signal in response to the virtual inverted RF signal;

a capacitor provided between the control portion of the second transistor and a ground; and a resonating means connected to the RF signal input port, the control portion of the first transistor, and the control portion of the second transistor, the resonating means including the capacitor, the resonating means being provided to reduce a harmonic of the RF signal.

2. The mixer circuit of claim 1, wherein the resonating means is provided such that a frequency of the harmonic of the RF signal becomes a resonance frequency.

3. The mixer circuit of claim 2, wherein the resonating means is provided such that a frequency of a third harmonic of the RF signal becomes the resonance frequency.

4. The mixer circuit of claim 1, wherein the resonating means comprises a first resistor connected between the capacitor and the control portion of the first transistor.

5. The mixer circuit of claim 3, wherein the resonating means comprises a first inductor connected between the capacitor and the control portion of the first transistor.

6. The mixer circuit of claim 1, wherein each of the first and second transistors is a bipolar transistor, each of the respective control portions of the first and second transistors is a base, the first transistor outputs the amplified RF signal from a collector thereof in response to the RF signal inputted to the base thereof, and the second transistor outputs the amplified inverted RF signal from a collector thereof in response to the virtual inverted RF signal inputted to the base thereof.

7. The mixer circuit of claim 1, wherein each of the first and second transistors is a field effect transistor having a gate, a source, and a drain, each of the respective control portions of the first and second transistors is the gate thereof, the first transistor outputs the amplified RF signal from the drain thereof in response to the RF signal inputted to the gate thereof, and the second transistor outputs the amplified inverted RF signal from the drain thereof in response to the virtual inverted RF signal inputted to the gate thereof.

8. The mixer circuit of claim 1, wherein the differential amplifier circuit has:

a first resistor connected to the first transistor and the second transistor;

a second resistor connected between the first transistor and the first resistor; and a third resistor connected between the second transistor and the first resistor.

9. The mixer circuit of claim 1, wherein the differential amplifier circuit has:

a first resistor connected to the first transistor and the second transistor;

a first inductor connected between the first transistor and the first resistor; and a second inductor connected between the second transistor and the first resistor.

10. The mixer circuit of claim 9, wherein the first resistor is a current source.

11. The mixer circuit of claim 1, wherein the RF signal has a frequency of 0.8 GHz or more.

12. A differential amplifier circuit comprising:

an RF signal input port for receiving an RF signal;

a first transistor having a control portion for receiving the RF signal inputted to the RF signal input port to output an amplified RF signal in response to the RF signal;

a second transistor having a control portion for receiving a virtual inverted RF signal opposite in phase to the RF signal to output an amplified inverted RF signal in response to the virtual inverted RF signal;

a capacitor provided between the control portion of the second transistor and a ground; and resonating means connected to each of the RF signal input port, the control portion of the first transistor, and the control portion of the second transistor, the resonating means including the capacitor, the resonating means being provided to reduce a harmonic of the RF signal.

13. The differential amplifier circuit of claim 12, wherein the resonating means is provided such that a frequency of the harmonic of the RF signal becomes a resonance frequency.

14. The differential amplifier circuit of claim 13, wherein the resonating means is provided such that a frequency of a third harmonic of the RF signal becomes the resonance frequency.

15. The differential amplifier circuit of claim 13, wherein the resonating means comprises a first resistor connected between the capacitor and the control portion of the first transistor.

16. The differential amplifier circuit of claim 13, wherein the resonating means comprises a first inductor connected between the capacitor and the control portion of the first transistor.

17. The differential amplifier circuit of claim 13, wherein each of the first and second transistors is a bipolar transistor, each of the respective control portions of the first and second transistors is a base, the first transistor outputs the amplified RF signal from a collector thereof in response to the RF signal inputted to the base thereof, and the second transistor outputs the amplified inverted RF signal from a collector thereof in response to the virtual inverted RF signal inputted to the base thereof.

18. The differential amplifier circuit of claim 13, wherein each of the first and second transistors is a field effect transistor having a gate, a source, and a drain, each of the respective control portions of the first and second transistors is the gate thereof, the first transistor outputs the amplified RF signal from the drain thereof in response to the RF signal inputted to the gate thereof, and the second transistor outputs the amplified inverted RF signal from the drain thereof in response to the virtual inverted RF signal inputted to the gate thereof.

19. The differential amplifier circuit of claim 13, wherein the differential amplifier circuit has:

a first resistor connected to the first transistor and the second transistor;

a second resistor connected between the first transistor and the first resistor; and a third resistor connected between the second transistor and the first resistor.

20. The differential amplifier circuit of claim 13, wherein the differential amplifier circuit has:

a first resistor connected to the first transistor and the second transistor;

a first inductor connected between the first transistor and the first resistor; and a second inductor connected between the second transistor and the first resistor.

21. The differential amplifier circuit of claim 20, wherein the first resistor is a current source.

22. The differential amplifier circuit of claim 13, wherein the RF signal has a frequency of 0.8 GHz or more.

* * * * *